US010757837B2

(12) United States Patent
Rodriguez

(10) Patent No.: US 10,757,837 B2
(45) Date of Patent: Aug. 25, 2020

(54) CONTROLLING AIR CIRCULATION IN A DATA CENTER

(71) Applicant: International Business Machines Corporation, Armonk, NY (US)

(72) Inventor: Jean-Michel Rodriguez, Mauguio (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/397,149

(22) Filed: Apr. 29, 2019

(65) Prior Publication Data

US 2019/0254197 A1    Aug. 15, 2019

Related U.S. Application Data

(63) Continuation of application No. 14/773,070, filed as application No. PCT/IB2014/060102 on Mar. 24, 2014, now Pat. No. 10,362,714.

(30) Foreign Application Priority Data

Apr. 17, 2013  (GB) .................................. 1306951.3

(51) Int. Cl.
 *H05K 7/20*  (2006.01)
(52) U.S. Cl.
 CPC ..... *H05K 7/20745* (2013.01); *H05K 7/20836* (2013.01)
(58) Field of Classification Search
 CPC ........... H05K 7/20709; H05K 7/20718; H05K 7/20727; H05K 7/20745; H05K 7/2059;
 (Continued)

(56) References Cited

U.S. PATENT DOCUMENTS 6,896,612 B1 * 5/2005 Novotny ............ H05K 7/20618
  361/691
7,568,360 B1   8/2009 Bash
  (Continued)

FOREIGN PATENT DOCUMENTS

CN       102405452 A    4/2012
CN       102686952 B    7/2015
  (Continued)

OTHER PUBLICATIONS

GB Application 1306951.3, entitled "Energy Efficient Data Center," filed Apr. 17, 2013.
(Continued)

*Primary Examiner* — Nelson J Nieves
(74) *Attorney, Agent, or Firm* — Grant M. McNeilly

(57) ABSTRACT

A method of controlling air circulation in a data center system. The data center system includes: a cold aisle; a hot aisle including a floor element and a ceiling element; a server rack comprising a controller and servers separating the cold aisle from the hot aisle; and an air conditioning unit. The method includes: toggling, by the controller, the hot aisle between: (a) a first configuration in which the ceiling element is opened and the floor element is closed and (b) a second configuration in which the ceiling element is closed and the floor element is opened, wherein the first configuration enables circulation of air from the from the hot aisle to the cold aisle via the air conditioning unit, and wherein the second configuration enables circulation of air from the from the hot aisle to the cold aisle without the circulated air passing through the air conditioning unit.

20 Claims, 4 Drawing Sheets

(58) Field of Classification Search
CPC .......... H05K 7/20618; H05K 7/20754; H05K 7/20836; H05K 7/20181; H05K 7/20145
See application file for complete search history.

(56) References Cited

U.S. PATENT DOCUMENTS

| | | |
|---|---|---|
| 7,753,766 B2 | 7/2010 | Matser |
| 8,151,578 B1 | 4/2012 | Morales |
| 8,156,753 B2 | 4/2012 | Vangilder |
| 8,302,874 B2 | 11/2012 | Jian |
| 2004/0109288 A1 | 6/2004 | Beitelmal |
| 2005/0011208 A1 | 1/2005 | Dobbs |
| 2006/0086119 A1 | 4/2006 | Malone |
| 2009/0259343 A1 | 10/2009 | Rasmussen |
| 2010/0154448 A1 | 6/2010 | Hay |
| 2010/0263830 A1 | 10/2010 | Noteboom |
| 2010/0296915 A1 | 11/2010 | Suzuki |
| 2011/0028081 A1 | 2/2011 | Hopkins |
| 2011/0083824 A1 | 4/2011 | Rogers |
| 2011/0151765 A1 | 6/2011 | Chen |
| 2011/0182028 A1 | 7/2011 | Tan |
| 2011/0223849 A1 | 9/2011 | Ishimine |
| 2011/0239683 A1 | 10/2011 | Czamara |
| 2011/0303406 A1 | 12/2011 | Takeda |
| 2011/0306287 A1 | 12/2011 | Takagi |
| 2012/0024502 A1 | 2/2012 | Khalifa |
| 2012/0033377 A1 | 2/2012 | Salpeter |
| 2012/0037233 A1 | 2/2012 | Seeliger |
| 2012/0041600 A1 | 2/2012 | Michael |
| 2012/0073840 A1 | 3/2012 | Prieur |
| 2012/0097360 A1 | 4/2012 | Ohba |
| 2012/0100795 A1 | 4/2012 | Ishimine |
| 2012/0100798 A1 | 4/2012 | Bermudez |
| 2012/0234527 A1 | 9/2012 | Murayama |
| 2012/0281352 A1 | 11/2012 | Namek |
| 2013/0075057 A1 | 3/2013 | Johnson |
| 2013/0098597 A1 | 4/2013 | Fujimoto |
| 2013/0242504 A1 | 9/2013 | Cartes |
| 2013/0258582 A1 | 10/2013 | Shelnutt |
| 2013/0283837 A1 | 10/2013 | Takahashi |
| 2013/0340535 A1 | 12/2013 | Sano |
| 2014/0069127 A1 | 3/2014 | Bailey |
| 2014/0187137 A1 | 7/2014 | Yang |
| 2014/0190198 A1 | 7/2014 | Slessman |
| 2014/0223946 A1 | 8/2014 | Hall |
| 2014/0240917 A1 | 8/2014 | Nicolai |
| 2014/0349563 A1 | 11/2014 | Honda |

FOREIGN PATENT DOCUMENTS

| | | |
|---|---|---|
| JP | 2011021872 A | 2/2011 |
| JP | 2011133129 A | 7/2011 |
| JP | 2011226737 A | 11/2011 |
| JP | 5579518 B2 | 8/2017 |
| WO | 2011160933 A1 | 12/2011 |
| WO | 2014170772 A3 | 2/2015 |

OTHER PUBLICATIONS

International Search Report and Written Opinion (PCT) dated Dec. 30, 2014 for International Application PCT/IB2014/060102.
Jiang Yi, "Computer aided monitoring and control system in HVAC (part 2): Monitoring and control of air conditioning systems", Mar. 27, 1997, 14 pages, <http://en.cnki.com.cn/Article_en/CJFDTOTAL-NTKT703.010.htm>.
List of IBM Patents or Patent Applications Treated as Related, Apr. 23, 2019, 2 pages.
Patel et al., "Smart Cooling of Data Centers", Advances in Electronic Packaging 2003, vol. 2, Jul. 6-11, 2003, 2003 International Electronic Packaging Technical Conference and Exhibition, Maui, Hawaii, The American Society of Mechanical Engineers, 10 pages.
Rodriguez et al., "Controlling Air Circulation in a Data Center," U.S. Appl. No. 14/773,070, filed Sep. 4, 2015.

* cited by examiner

CONTROLLING AIR CIRCULATION IN A DATA CENTER

FIELD OF THE INVENTION

The present invention relates to a data center system in which hot and cold aisles are separated by server racks.

The present invention further relates to a server rack for such a data center system.

The present invention yet further relates to a method of controlling the temperature in a data center.

BACKGROUND

Data centers are large computer rooms that are organized in so-called hot aisles and cold aisles. Server racks separate the hot aisles from the cold aisles, with the servers in the server racks typically arranged to draw cold air from the cold aisles to cool the servers in the racks and expel the heated air into the hot aisles. A computer room air conditioning (CRAC) unit draws in air from the hot aisles, typically through ceiling tiles of the computer room and returns the cooled air to the cold aisles via perforated floor tiles and/or grates in the cold aisles. The conduits required for the air flow from and to the CRAC unit are typically defined by a suspended ceiling and a raised floor, as is well-known per se.

Data centers require large amounts of energy to operate. A substantial part of this energy is being consumed by the CRAC unit. As is well-known, the efficiency of air conditioning units such as CRAC units depends on the temperature of the inbound air, i.e. the air drawn from the hot aisles. In case of low server activity, the air of the associated hot aisle may have a relatively low temperature, which therefore negatively impacts on the efficiency of the CRAC unit. This is undesirable, as this pushes up the energy consumption of the data center as a whole, which not only increases the operation cost of the data center but also increases the risk of black-outs if the energy demand of the data center cannot be met, which is highly undesirable. It is therefore desirable to try and improve the energy efficiency of data centers.

U.S. Pat. No. 8,156,753 B2 discloses a data center cooling solution providing techniques for using baffles, doors and roof sections to prevent warm air from being entrained into a cold aisle in a data center, wherein the data center generally contains an air cooling system and a raised floor structure. The raised floor structure is configured to deliver cool air into the data center through a plurality of grates and perforated tiles in the floor. Electronic equipment racks are disposed around the grates and perforated tiles, such that the front faces of the equipment racks face the grates and perforated tiles. A collection of baffles, doors or roof sections inhibit the mixing of the cool air delivered by the air cooling system and the warm air exhausted by the electronic equipment. This improves cooling of the servers and therefore increases the temperature gradient between the hot aisles and cold aisles. However, this solution does not address the problem of CRAC inefficiency if this temperature gradient is small, e.g. because of low server activity.

US 2011/0303406 A1 discloses a computer room air-conditioning system including a temperature detection unit which is provided for each of a front and a back of each rack, and which measures air temperatures at the front and the back of the rack. A control device for acquiring a measured temperature by each temperature detection unit and for performing control based on the measured temperature is also present. With the configuration, the control device includes a temperature difference calculation unit for calculating a temperature difference between cool air at the front and warm air at the back of each rack based on each measured and acquired temperature; and a heating element, i.e. server, cooling control unit for controlling by adjustment an amount of flow of cool air from the underfloor space to the computer room based on the calculated temperature difference. This improves the energy efficiency of the data center because the air flow to and from the CRAC unit is reduced for small temperature gradients. Nevertheless, this still requires the CRAC unit to operate at reduced efficiency, albeit at reduced air volumes.

BRIEF SUMMARY OF THE INVENTION

The present invention seeks to provide a data center system that can be operated at further improved energy efficiency.

The present invention further seeks to provide a server rack for use in such a data center system.

The present invention yet further seeks to provide a method of controlling the temperature in a data center.

According to an aspect of the present invention, there is provided data center system comprising a cold aisle comprising a first perforated floor element; a hot aisle comprising a second perforated floor element and a ceiling element that each can be opened and closed; a server rack comprising a plurality of servers separating the cold aisle from the hot aisle; an air conditioning unit having an input coupled to the hot aisle via the ceiling element and an output coupled to the cold aisle via the first perforated floor element; and a controller arranged to toggle the data center system between a first configuration in which the ceiling element is opened and the second perforated floor element is closed; and a second configuration in which the ceiling element is closed and the second perforated floor element is opened.

In this system, the air conditioning (AC) unit can be bypassed if there is no need to feed the air from the hot aisle to the AC unit. In this bypass mode, the air from the hot aisle is recirculated to the cold aisle via the raised floor including the first perforated floor element and the adjustable second perforated floor element. The floor elements may for instance be tiles. This has the advantage that the AC unit can be kept in a standby mode in situations where the AC unit would otherwise have operated at reduced efficiency, thus improving the energy efficiency of the data center system.

The controller may be arranged to toggle between the first configuration and the second configuration upon the temperature in the cold aisle reaching a defined threshold, such as 28° C. If the temperature in the cold aisle exceeds this defined threshold, cooling of the servers in the server racks may be compromised, such that upon reaching this temperature the AC unit should be included in the recirculation loop to ensure that the air temperature in the cold aisle does not exceed this temperature.

Alternatively or additionally, the controller may be arranged to toggle between the first configuration and the second configuration upon the temperature in the hot aisle reaching a defined further threshold, such as 45° C. This further threshold may be selected based on the efficiency characteristics of the AC unit, such that the AC unit is only activated when it can operate in a sufficiently efficient manner.

The server rack may comprise a temperature sensor coupled to the controller, said controller being responsive to said temperature sensor, which may be located at the front of the server rack to sense the temperature in the cold aisle or at the back of the server rack to sense the temperature in the hot aisle. The server rack may comprise a pair of such temperature sensors, i.e. a temperature sensor at the front of the rack and a further temperature sensor at the back of the rack, with the controller being responsive to each of said temperature sensors.

In a particularly advantageous embodiment, the controller is integrated in the server rack, such that no separate controllers have to be provided in the data center system, thus reducing implementation complexity.

The data center system may comprise a plurality of server racks separating the hot aisle from the cold aisle. The data center system may further comprise a plurality of said controllers, wherein each of said server racks comprises one of said controllers, and wherein the ceiling element and the second perforated floor element are responsive to each individual controller. This has the advantage each server rack can trigger the activation of the AC unit, for instance when it is detected that the servers in a particular rack switch to a mode of high activity, thereby providing a more fine-grained level of control over the temperature in the data center.

According to another aspect of the present invention, there is provided a server rack for use in the data center system according to an embodiment of the present invention, the server rack comprising a controller arranged to toggle the data center system between a first configuration in which the ceiling element is opened and the second perforated floor element is closed; and a second configuration in which the ceiling element is closed and the second perforated floor element is opened.

The server rack may further comprise at least one temperature sensor coupled to the controller for sensing the temperature in the hot aisle or cold aisle, as previously explained.

In accordance with yet another aspect of the present invention, there is provided a method of controlling the temperature in a data center system comprising a cold aisle comprising a first perforated floor element; a hot aisle comprising a second perforated floor element and a ceiling element that each can be opened and closed; a server rack comprising a plurality of servers separating the cold aisle from the hot aisle; and an air conditioning unit having an input coupled to the hot aisle via the ceiling element and an output coupled to the cold aisle via the first perforated floor element; the method comprising recirculating air from the hot aisle to the cold aisle via the second perforated tile and the first perforated tile whilst keeping the ceiling element closed; and upon a parameter indicative of server activity reaching a defined threshold, recirculating air from the hot aisle to the cold aisle via the ceiling element and the air conditioning unit whilst keeping second perforated tile closed. This ensures an energy efficient operation of such a data center, as explained in more detail above.

In an embodiment, the method further comprises generating a control signal at the server rack to control said recirculation.

BRIEF DESCRIPTION OF THE DRAWINGS

Preferred embodiments of the present invention will now be described, by way of example only, with reference to the following drawings, in which.

DETAILED DESCRIPTION OF THE EMBODIMENTS

Figure 1:
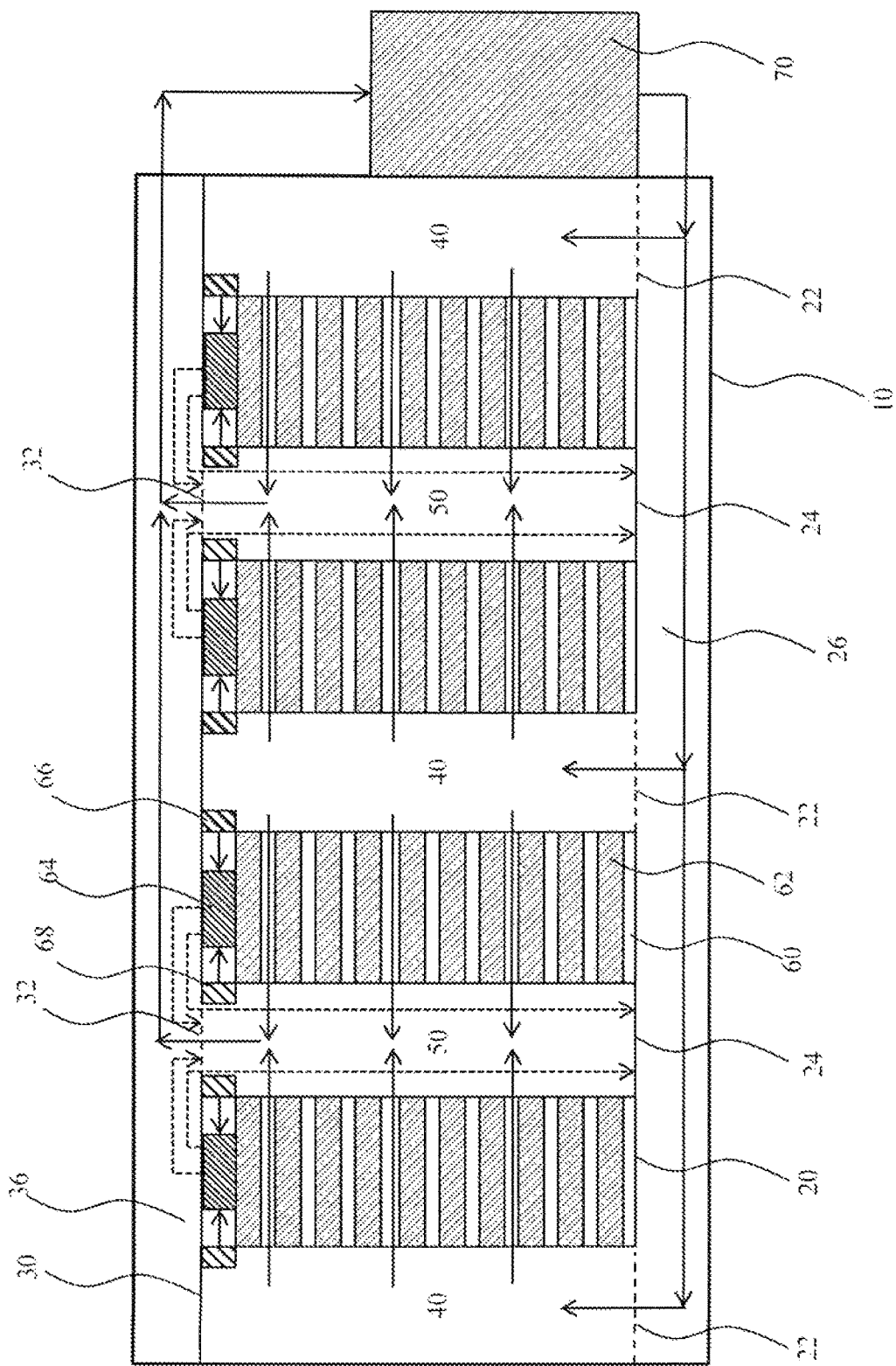
FIG. 1 schematically depicts a data center system according to an embodiment of the present invention in a first configuration.

It should be understood that the Figures are merely schematic and are not drawn to scale. It should also be understood that the same reference numerals are used throughout the Figures to indicate the same or similar parts.

In the context of the present application, where embodiments of the present invention constitute a method, it should be understood that such a method is a process for execution by a computer, i.e. is a computer-implementable method. The various steps of the method therefore reflect various parts of a computer program, e.g. various parts of one or more algorithms.

FIG. 1 schematically depicts a data center system according to an embodiment of the present invention in a first configuration. The data center system is placed in a computer room 10 having a raised floor 20 and a ceiling 30 such as a suspended ceiling. The clearance 26 between the raised floor 20 and the floor of the computer room 10 defines a first conduit and the clearance 36 between the ceiling 30 and the ceiling of the computer room 20 defines a second conduit. The first conduit is used to transport cool air produced by the air conditioning unit 70 to the cold aisles 40 through first perforated floor elements 22 in the raised floor 20. The second conduit is used to transport hot air from the hot aisles 50 through ceiling elements 32 to the air conditioning unit 70 for cooling. The air circulated in this manner is indicated by the solid arrows in FIG. 1. It is noted for the avoidance of doubt that the air conditioning unit 70 may be placed in any suitable location, e.g. inside or outside the computer room 10.

As is well-known per se, rows of server racks 60 separate the cold aisles 40 from the hot aisles 50. The server racks typically comprise one or more servers 62 having a front panel facing a cold aisle 40 and a back panel facing a hot aisle 50. Each server 62 typically comprises at least one fan that forces air from the cold aisle 40 through the server 62 towards the hot aisle 50 in order to cool the one or more processing elements and other elements generating heat in the server 62. This is indicated by the solid arrows through the server racks 60.

In accordance with an embodiment of the present invention, the hot aisles further comprise a configurable second perforated floor element 24 that forms part of the raised floor 20. The configurable second perforated floor element 24 can be switched between a first configuration in which the perforations are closed, as shown in FIG. 1, and a second configuration in which the perforations are opened, as will be explained in more detail later. Similarly, the ceiling elements 32 are configurable ceiling elements that can be switched between a first configuration in which the ceiling element is opened, as shown in FIG. 1, and a second configuration in which the ceiling element is closed, as will be explained in more detail later.

The specific implementation of the first and second perforated floor elements 22 and 24 and the ceiling element 32 is not particularly limited. Any suitable implementation may be chosen. For instance, the first and second perforated floor elements 22 and 24 may be perforated floor tiles, grates and so on. Similarly, the ceiling element 32 may be a perforated ceiling tile, a grate forming part of the ceiling 30, or may be a valve-like element mounted on a single server rack 60 or on opposing server racks 60, with the valve being arranged to expose an opening in the ceiling 30 in the first configuration and cover this opening in the second configuration of the ceiling element 30. It should be understood that any element that can be used to configurably cover and uncover an opening in the raised floor 20 and the ceiling 30 may be used for such a purpose.

The data center system further comprises a plurality of temperature sensors for monitoring the temperature in at least one of the cold aisles 40 and the hot aisles 50. For instance, in an embodiment, the data center system may comprise a temperature sensor 66 in each of the cold aisles 40. In an alternative embodiment, the data center system may comprise a temperature sensor 68 in each of the hot aisles 50. In yet another embodiment, which is shown in FIG. 1, the data center system may comprise a temperature sensor 66 in each of the cold aisles 40 as well as a temperature sensor 68 in each of the hot aisles 50. The temperature sensors are coupled to a controller 64 arranged to toggle the second perforated floor element 24 and the ceiling element 32 between the first configuration in which the ceiling element 32 is opened and the second perforated floor element 24 is closed and the second configuration in which the ceiling element 32 is closed and the second perforated floor element 24 is opened. The first configuration is shown in FIG. 1 and the second configuration is shown in FIG. 2.

Figure 2:
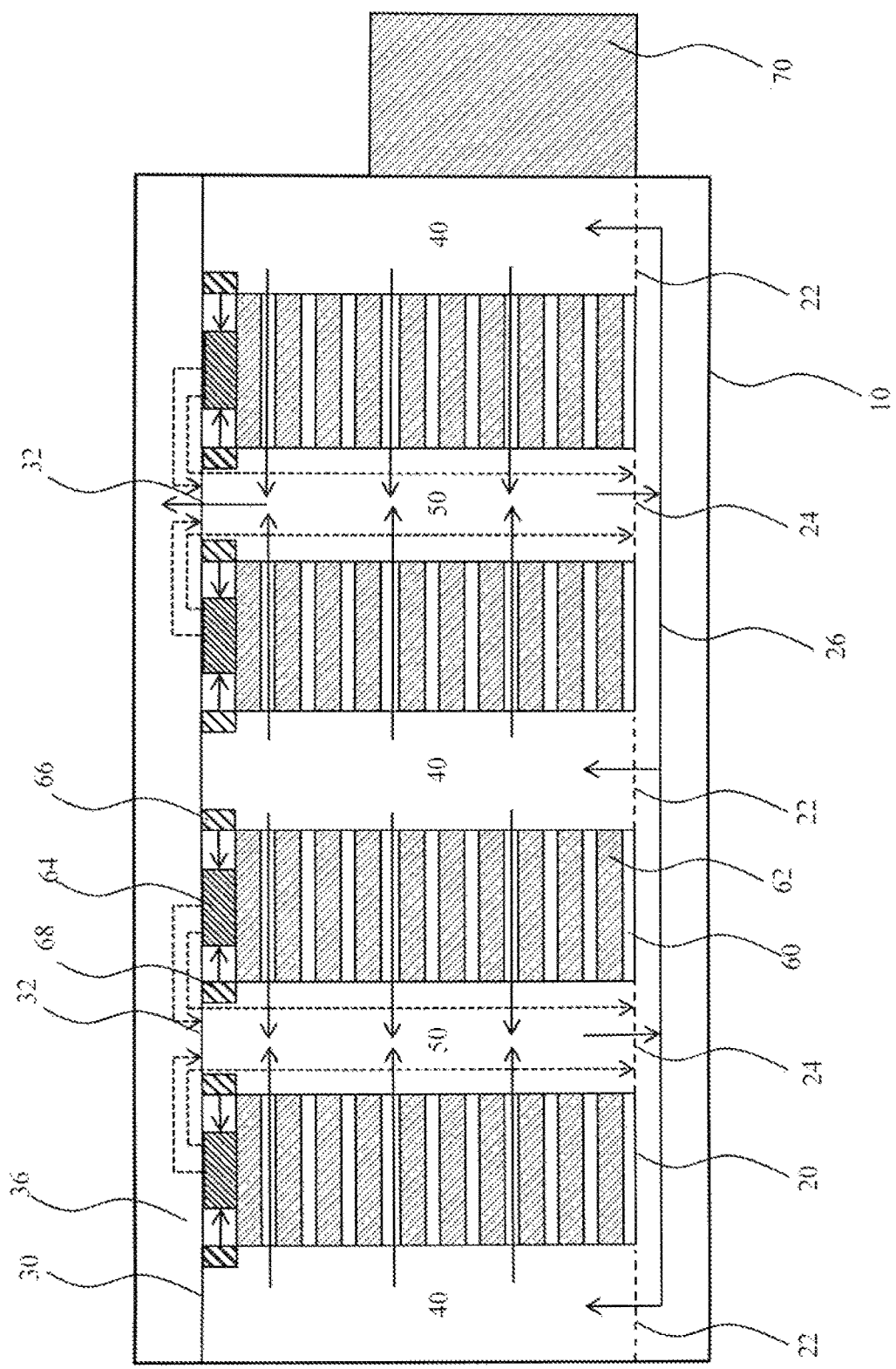
FIG. 2 schematically depicts a data center system according to an embodiment of the present invention in a second configuration.

In the second configuration shown in FIG. 2, the air conditioning unit 70 is bypassed and the air forced through the server racks 60 by the fans in the servers 62 from a cold aisle 40 to a hot aisle 50 is recirculated through a configurable second perforated floor element 24 into the first conduit 26 and into a cold aisle 40 through a first perforated floor element 22.

The switching between the first configuration in FIG. 1 and the second configuration in FIG. 2 is performed to avoid the air conditioning unit 70 operating at reduced efficiencies, which for instance occurs if the air temperature of the air transported from the hot aisles 50 to the air conditioning unit 70 is below a certain temperature, e.g. 45° C. This may indicate that the servers 62 operate below full capacity, such that the cooling of the servers 62 in the server racks 60 is less critical, such that less cold air, i.e. the air from the hot aisles 50 may be used to cool the servers 62 without having to cool this air using the air conditioning unit 70. If this is the case, the data center system is configured as shown in FIG. 2, in which the air conditioning unit 70 is bypassed and the air from the hot aisles 50 is fed back to the cold aisles 40 through the opened second perforated floor element 24 and the first perforated floor element 22.

To this end, the controllers 64 may directly or indirectly control the second perforated floor element 24 and the ceiling element 32 in response to one or more temperature sensors 68 in the hot aisles 50, as indicated by the dashed arrows in FIG. 1 and FIG. 2. In an embodiment, the controllers 64 of the server racks 60 backing the hot aisle 50 are in direct control of the second perforated floor elements 24 and the ceiling elements 32 of the hot aisles 50.

The controllers 64 may be interconnected by a network (not shown for the sake of clarity) that is further conductively coupled to the second perforated floor elements 24 and the ceiling elements 32. Upon one of the controllers 64 signaling that the temperature in a hot aisle 50 has reached a critical value, i.e. a defined threshold, the ceiling elements 32 will be switched to an opened state and the second perforated floor elements 24 will be switched to a closed state as shown in FIG. 1 such that the air from the hot aisles 50 is fed to the air conditioning unit 70.

In the absence of such a signal on the network, the ceiling elements 32 will be switched to a closed state and the second perforated floor elements 24 will be switched to an opened state as shown in FIG. 2 such that the air from the hot aisles 50 is fed back into the cold aisles 40, bypassing the air conditioning unit 70. In an embodiment, the air conditioning unit 70 is also responsive to the control signal generated by the controllers 64 such that upon detection of the control signal the air conditioning unit 70 may switch from a standby to an active mode.

In another embodiment, which is particularly preferable, each of the controllers 64 is responsive to a temperature sensor 66 in one of the cold aisles 40, such that the controllers 64 can switch from the second configuration in FIG. 2 in which the air conditioning unit 70 is bypassed to the first configuration in FIG. 1 in which the air conditioning unit 70 is included in the air flow from the hot aisles 50 to the cold aisles 40. This is for instance advantageous if the servers 62 must be cooled by air not exceeding a defined further temperature in order to guarantee that the servers 62 will not overheat. In an embodiment, this defined further temperature threshold may be 28° C.

In yet another embodiment, the each of controllers 64 may be responsive to a temperature sensor 66 in one of the cold aisles 40 as well as to a temperature sensor 68 in one of the hot aisles 50 such that the configuration of the data center system may be switched between the first configuration of FIG. 1 and the second configuration of FIG. 2 when at least one of the temperature sensors 66 and 68 indicates that the aforementioned defined temperature threshold has been reached, such that the air conditioning unit 70 can be activated and included in the air recirculation path from the hot aisles 50 and the cold aisles 40 as explained in more detail above.

At this point, it is noted that in the above detailed description, the controllers 64 and temperature sensor 66 and/or temperature sensor 68 are shown as forming part of a server rack 60. It should however be understood that this is by way of non-limiting example only. It is equally feasible to provide at least one of the controller 64, the temperature sensor 66 and/or temperature sensor 68 as separate components of the data center system without departing from the teachings of the present invention.

Figure 3:
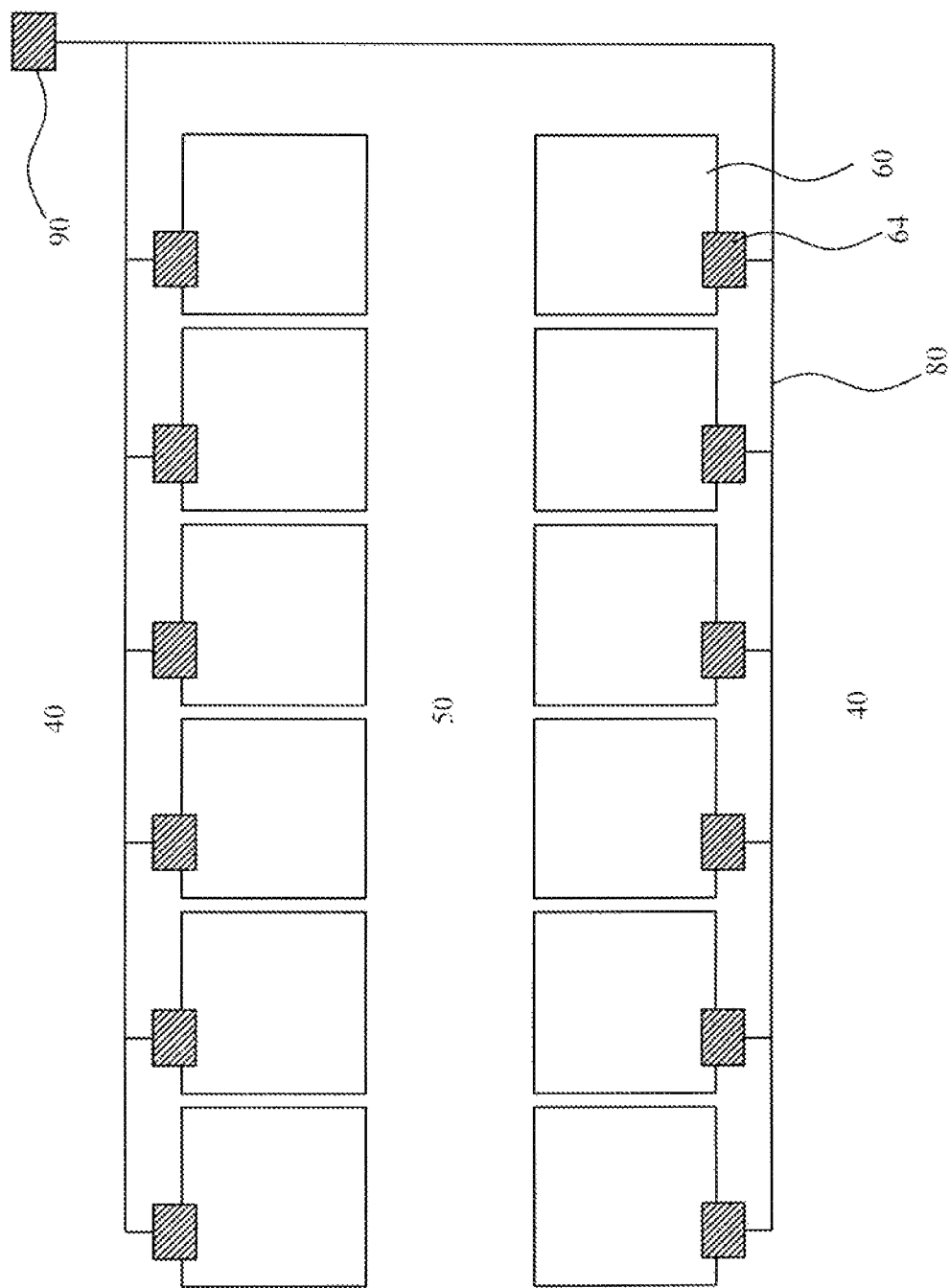
FIG. 3 schematically depicts an aspect of a data center system according to an embodiment of the present invention.

FIG. 3 schematically depicts an aspect of the data center system according to an embodiment of the present invention. The data center system may comprise a network 80 connecting the various controllers 64 of the server racks 60 to a master controller 90 that controls the ceiling elements 32 and the second perforated floor elements 24 in the hot aisles 50, and may additionally control the air conditioning unit 70 in another embodiment. The master controller may toggle the ceiling elements 32 and the second perforated floor elements 24 in the hot aisles 50 between the first configuration and the second configuration in the presence or absence of a control signal from the controllers 64 signaling that the temperature in one of the hot aisles 50 and/or one of the cold aisles 40 has reached a defined threshold, as previously explained.

Figure 4:
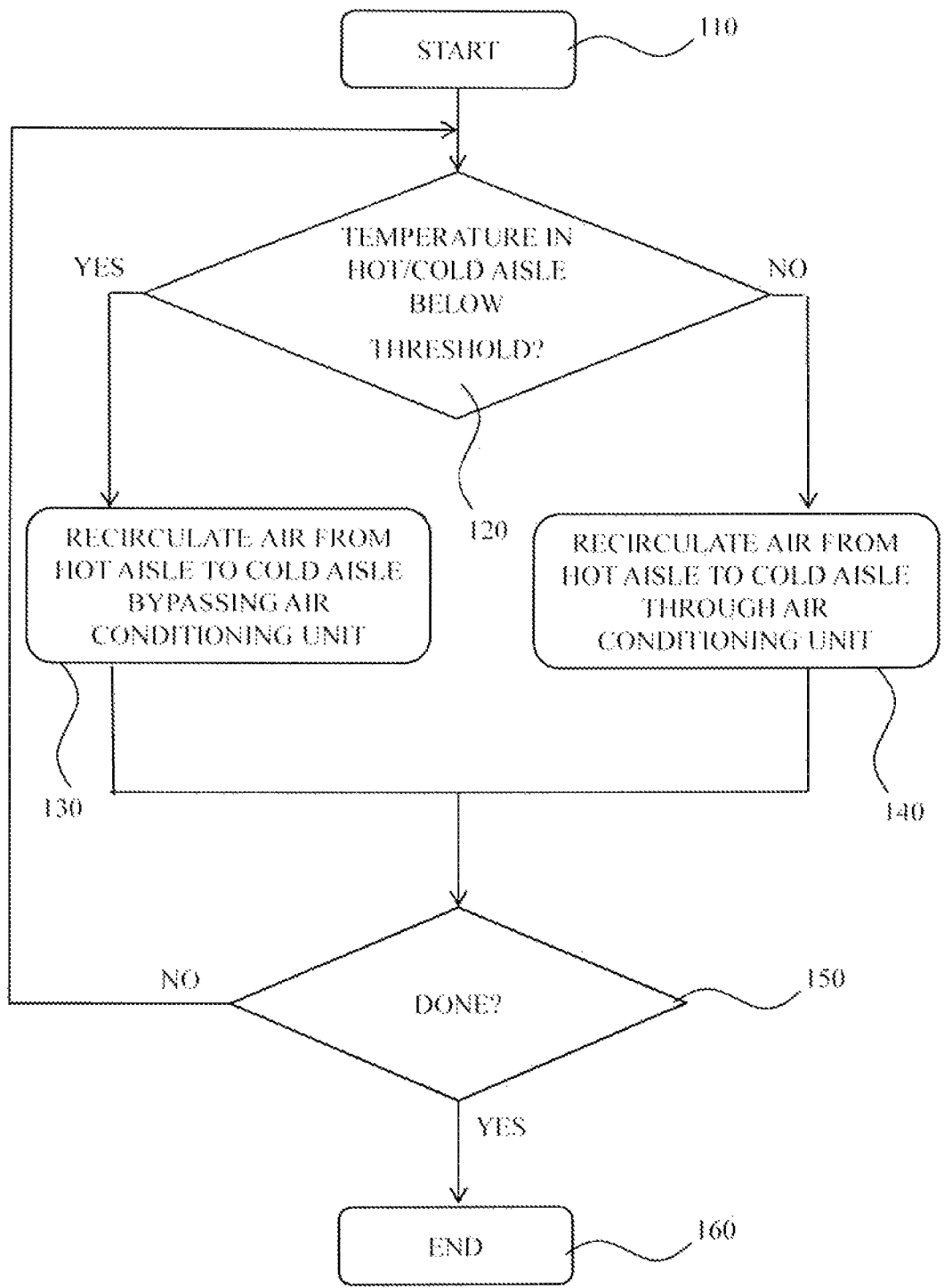
FIG. 4 shows a flow chart of a method of controlling the temperature in a data center according to an embodiment of the present invention.

FIG. 4 schematically depicts an embodiment of the method of the present invention. Upon initialization of the data center system in step 110, it is checked in step 120 if the temperature in the cold aisles 40 and/or the hot aisles 50 is below a defined threshold. Preferably, it is checked if the temperature in the cold aisles 40 is below a defined threshold, e.g. 28° C. and/or the temperature in the hot aisles 50 is below a defined threshold, e.g. 45° C. If this is the case, the method proceeds to step 130 in which the ceiling elements 32 and the second perforated floor elements 24 are switched to the second configuration in which the ceiling elements 32 are closed and the second perforated floor elements 24 are opened to bypass the air conditioning unit 70. If this is not the case, the method proceeds to step 140 in which the ceiling elements 32 and the second perforated floor elements 24 are switched to the first configuration in which the ceiling elements 32 are opened and the second perforated floor elements 24 are closed to include the air conditioning unit 70 in the air recirculation from the hot aisles 50 to the cold aisles 40. It is checked in step 150 if operation of the data center system is to continue. If so, the method returns to step 110. Otherwise, the method terminates in step 160. In an embodiment, the decision making process in step 120 is triggered by a control signal generated at the server rack 60 to control said recirculation, as has been explained in more detail above.

In the above detailed description, the controllers 64 are responsive to one of more temperature sensors 66 and/or 68. However, it should be understood that alternative embodiments in which the controllers 64 are responsive to another parameter indicative of server activity are equally feasible. For instance, the controllers 64 may monitor the activity or power consumption of the servers 62 in an associated server rack 60, and generate the control signal to toggle the configuration of the data center system between the first configuration and the second configuration upon the activity or power consumption of the servers 62 reaching a defined threshold instead. Other suitable parameters will be apparent to the skilled person.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A data center system comprising:
   a first cold aisle comprising a first perforated floor element;
   a first hot aisle comprising a second perforated floor element that can be opened and closed;
   a server rack comprising a plurality of servers separating the first cold aisle from the first hot aisle;
   an air conditioning unit having an input coupled to the first hot aisle and an output coupled to the first cold aisle via the first perforated floor element; and
   a controller configured to toggle the data center system between:
      a first configuration in which the second perforated floor element is closed and the air conditioning unit is active; and
      a second configuration in which the second perforated floor element is in a full open position providing a direct path between the first hot aisle and the first cold aisle and bypassing the air conditioning unit and keeping the air conditioning unit in a standby mode.

2. The system of claim 1, the first cold aisle further comprising a temperature sensor, wherein the temperature sensor detects a temperature of the first cold aisle and wherein the controller is configured to toggle between the first configuration and the second configuration upon the temperature in the first cold aisle reaching a defined threshold.

3. The system of claim 2, wherein the defined threshold is 28° C.

4. The system of claim 1, further comprising:
   a first conduit connected to the second perforated floor element; and
   a third perforated floor element in a second hot aisle connected to the first conduit.

5. The system of claim 4, further comprising:
   a second conduit connected to the first perforated floor element; and
   a fourth perforated floor element in a second cold aisle connected to the second conduit.

6. The system of claim 1, wherein the server rack comprises a temperature sensor coupled to the controller, said controller being responsive to said temperature sensor.

7. The system of claim 1, wherein the controller is integrated in the server rack.

8. The system of claim 1, wherein the system comprises a plurality of server racks, of which the server rack is one, separating the first hot aisle from the first cold aisle.

9. A data center system comprising:
   a first cold aisle comprising a first perforated floor element and a temperature sensor;
   a first hot aisle comprising a second perforated floor element that can be opened and closed;
   a server rack comprising a plurality of servers separating the first cold aisle from the first hot aisle;
   an air conditioning unit having an input coupled to the first hot aisle and an output coupled to the first cold aisle via the first perforated floor element; and
   a controller configured to toggle the data center system between:
      a first configuration, in which the second perforated floor element is closed and the air conditioning unit is active; and
      a second configuration, in which the second perforated floor element is in a full open position and keeping the air conditioning unit in a standby mode upon a temperature in the first hot aisle reaching a defined threshold.

10. The system of claim 9, further comprising:
    a first conduit connected to the second perforated floor element; and
    a third perforated floor element in a second hot aisle connected to the first conduit.

11. The system of claim 10, further comprising:
    a second conduit connected to the first perforated floor element; and
    a fourth perforated floor element in a second cold aisle connected to the second conduit.

12. The system of claim 9, wherein the defined threshold is 45° C.

13. The system of claim 9, wherein the server rack comprises a temperature sensor coupled to the controller, said controller being responsive to said temperature sensor.

14. The system of claim 9, wherein the controller is integrated in the server rack.

15. The system of claim 9, wherein the system comprises a plurality of server racks, of which the server rack is one, separating the first hot aisle from the first cold aisle.

16. The system of claim 15, further comprising a plurality of controllers, wherein each of the plurality of server racks comprises one of the plurality of controllers, and wherein the second perforated floor element is responsive to each of the plurality of controllers.

17. A method of controlling the temperature in a data center system comprising:
a first cold aisle comprising a first perforated floor element;
a first hot aisle comprising a second perforated floor element that can be opened and closed;
a server rack comprising a plurality of servers separating the first cold aisle from the first hot aisle;
an air conditioning unit having an input coupled to the first hot aisle and an output coupled to the first cold aisle via the first perforated floor element; and
a controller configured to toggle the data center system between:
a first configuration in which the second perforated floor element is closed and the air conditioning unit is active; and
a second configuration in which the second perforated floor element is in a full open position providing a direct path between the first hot aisle and the first cold aisle and bypassing the air conditioning unit and keeping the air conditioning unit in a standby mode;
the method comprising:
recirculating air from the first hot aisle to the first cold aisle via the second perforated floor element and the first perforated floor element; and
upon a parameter indicative of server activity reaching a defined threshold, recirculating air from the first hot aisle to the first cold aisle via the air conditioning unit whilst keeping the second perforated floor element closed.

18. The method of claim 17, further comprising generating a control signal at the server rack to control said recirculation.

19. The method of claim 17, wherein the data center system further comprises:
a first conduit connected to the second perforated floor element; and
a third perforated floor element in a second hot aisle connected to the first conduit.

20. The method of claim 19, wherein the data center system further comprises:
a second conduit connected to the first perforated floor element; and
a fourth perforated floor element in a second cold aisle connected to the second conduit.

* * * * *